(12) United States Patent
Rupin

(10) Patent No.: US 12,282,602 B2
(45) Date of Patent: Apr. 22, 2025

(54) PIEZOELECTRIC ACTUATORS WITH INCREASED DEFORMATION

(71) Applicant: VIBRA NOVA, Saint-Paul-de-Varces (FR)

(72) Inventor: Matthieu Rupin, Saint Martin d'Hères (FR)

(73) Assignee: VIBRA NOVA, Saint-Paul-de-Varces (FR)

( * ) Notice: Subject to any disclaimer, the term of this patent is extended or adjusted under 35 U.S.C. 154(b) by 821 days.

(21) Appl. No.: 17/417,994

(22) PCT Filed: Dec. 31, 2019

(86) PCT No.: PCT/FR2019/000223
§ 371 (c)(1),
(2) Date: Jun. 24, 2021

(87) PCT Pub. No.: WO2020/141264
PCT Pub. Date: Jul. 9, 2020

(65) Prior Publication Data
US 2022/0066557 A1    Mar. 3, 2022

(30) Foreign Application Priority Data
Dec. 31, 2018   (FR) .................................... 18 74409

(51) Int. Cl.
*G06F 3/01*    (2006.01)
*H10N 30/20*   (2023.01)
*H10N 30/80*   (2023.01)

(52) U.S. Cl.
CPC .......... *G06F 3/016* (2013.01); *H10N 30/2041* (2023.02); *H10N 30/802* (2023.02)

(58) Field of Classification Search
CPC ...... G06F 3/016; G06F 3/041; H10N 30/2041; H10N 30/204; H10N 30/802; B06B 1/0603
See application file for complete search history.

(56) References Cited

U.S. PATENT DOCUMENTS

| 7,053,527 B2* | 5/2006 | Mattsson | ............... H02N 2/026 310/331 |
| 2013/0328447 A1 | 12/2013 | Park et al. | |
| 2014/0306914 A1* | 10/2014 | Kagayama | .......... G06F 3/03547 345/173 |

FOREIGN PATENT DOCUMENTS

| EP | 2535119 A2 | 12/2012 |
| EP | 2571071 A2 | 3/2013 |
| WO | 9101814 A1 | 2/1991 |

OTHER PUBLICATIONS

International Preliminary Report on Patentability (PCT/IPEA/409) in corresponding International Application No. PCT/FR2019/000223 dated May 26, 2021.

(Continued)

*Primary Examiner* — Emily P Pham
(74) *Attorney, Agent, or Firm* — Buchanan Ingersoll & Rooney PC

(57) ABSTRACT

The invention relates to an electromechanical actuator with increased deformation, including, on the one hand, at least one drive element connected to a source of AC voltage so as to produce a deformation of the drive element and, on the other hand, a plate configured for amplifying the amplitude of the vibration that the drive element must transmit to a substrate to be actuated. A first face of the plate is rigidly fixed to the drive element and a second face of the plate, opposite to the first face, is fixed by means of an actuation lug to the substrate to be actuated.

21 Claims, 7 Drawing Sheets

(56) References Cited

OTHER PUBLICATIONS

International Search Report (PCT/ISA/210) and Written Opinion (PCT/ISA/237) mailed on May 12, 2020, by the European Patent Office as the International Searching Authority for International Application No. PCT/FR2019/000223.

* cited by examiner

PIEZOELECTRIC ACTUATORS WITH INCREASED DEFORMATION

The present invention relates to the field of electromechanical actuators with increased deformation, in particular piezoelectric actuators with increased deformation.

PRIOR ART

The use of piezoelectric actuators with increased deformation is already known in various contexts: sonar systems, ultrasonic cleaning systems, ultrasonic machining/welding techniques, HIFU (acronym for High Intensity Focused Ultrasound) systems, and numerous applications that require large amplitudes of displacement of the surface that it is sought to use.

Another example of use of piezoelectric actuators is that of the devices with haptic feedback using ultrasonic lubrication. However, in the case of a dissipative medium, such as for example plastic substrates or other viscoelastic media, large displacements of the surface are difficult to achieve by simple piezoelectric actuators in their conventional design.

Indeed, the known piezoelectric actuators allow a haptic feedback to be implemented based on a significant ultrasonic lubrication only on rigid, and hence non-dissipative, surfaces (in other words composed of a purely elastic material) notably metal or glass surfaces which are not in contact with any viscoelastic element of the adhesive type (or equivalent) creating dissipation of energy. In particular, in the field of screens, the known actuators are in thin layers and can only be used with touchscreens having an air gap between the surface glass and the display (OLED or LCD, for example), and the actuators must be directly applied to the glass so as to create a standing wave on it which is not dissipated by the viscoelastic part of the screen.

When the medium to be actuated is more dissipative, such as for example viscoelastic materials of the plastic, wood or other type, for the haptic effect to be readily sensed by a user, it is necessary to use piezoelectric actuators whose deformation is amplified with respect to that which would be obtained by a simple thin-film piezoelectric actuator.

However, the known piezoelectric actuators with increased deformation have several drawbacks which limit their use to certain applications, whose screens are excluded.

Thus, in an industrial context, having to employ piezoelectric actuators with increased deformation poses a certain number of problems.

In the first place, a mechanical reference is often required. In practice, it is often sought to maximize the deformation of one of the faces of the piezoelectric actuator, which involves embedding its opposing face into a substrate. However, achieving this embedding is not so easy. The substrate will need to be substantially more rigid and solid than the element to be actuated. For example, in order to actuate a display having a protective glass with a thickness of 2 mm, it will be necessary to anchor the actuator within a metal substrate of at least 1 cm in thickness. If a large number of actuators is required, this implies being able to add a significant metal structure only to provide this mechanical reference function.

Secondly, the size of the known actuators with increased deformation is significant and is not always compatible with the product into which it is sought to integrate it. By way of example, piezoelectric actuators are known, marketed under the trademark Thorlabs™, that are capable of creating deformations of around 10 to 30 µm and operating within a range of frequencies from 40 kHz to 120 kHz, but they have dimensions going from around 10 mm to 30 mm, greater by a factor of around 10 than the acceptable dimensions for use in certain applications, such as for example an integration into screens or other thin structures.

One variant of these resonant piezoelectric actuators exists with magnetostrictive actuators such as those described in the document WO 91/01814 A1, but their size remains of the same order because the effect of amplification is also based on a compression-expansion resonance whose wavelengths are centimeters in the range 20 kHz-120 kHz.

Thirdly, the cost of the known piezoelectric actuators with increased deformation greatly limits their number and their uses.

Other types of actuators with increased deformation exist such as those based on electro-active polymers, for example such as described in the document US 2013/328447 A1, but they are limited to low-frequency vibrations. In no case do they allow ultrasonic vibrations to be generated that are capable of creating a haptic feedback by ultrasonic lubrication.

AIM OF THE INVENTION

The main aim of the invention is to provide a novel type of electromechanical actuator with increased deformation, notably of piezoelectric actuator, capable of overcoming the aforementioned drawbacks of the known actuators.

In particular, one specific aim of the invention is to provide an actuator capable of operating without needing to embed one of its faces.

Another aim of the invention is to provide an actuator of very small size, namely from 2 to 5 mm in thickness, compatible with a use in a large number of new applications which involve displacement amplitudes of the substrate surface greater than those known, namely displacements from one to three microns within a range of ultrasound frequencies going from around 20 kHz to 200 kHz.

Another aim of the invention is to provide an actuator that is easy to manufacture and to use and whose cost is greatly reduced with respect to that of the known actuators, here again allowing its use in new applications to be generalized.

SUMMARY OF THE INVENTION

The principal of the present invention consists in coupling a drive element, for example a low-cost "common" monolithic piezoelectric ceramic, with a plate vibrating in flexure mode. The present description will be limited to piezoelectric actuators, without however limiting the scope of the invention, given that other types of drive elements (magnetic, electrostatic) could be used.

The actuator according to the invention is then composed of 3 elements:
  a miniaturized drive element, for example a piezoelectric ceramic of square, circular, or rectangular shape;
  a rigid plate, for example made of bronze, steel, zinc, etc., caused to vibrate by the miniaturized drive element and inducing an effect of amplification of the movement of the drive element;
  and an actuation lug, disposed on the rigid plate and sitting proud with respect to it, this actuation lug being designed to be applied against the surface of a substrate to be actuated. The actuation lug is placed on the plate, either of which it forms an integral part, or onto which it is mounted and fixed, notably by adhesive bonding.

The dimensions of the actuation lug are small with respect to the plate and it is centered with respect to the plate.

The three elements are rigidly connected together, for example by means of a strong adhesive capable of maintaining the cohesion between the elements even for movements of ultrasonic frequency which involve high mechanical forces, for example an adhesive of the two-component Epoxy type.

The subject of the invention is an electromechanical actuator with increased deformation, comprising, on the one hand, at least one drive element connected to a source of AC voltage so as to produce a deformation of said drive element and, on the other hand, a plate configured for amplifying the amplitude of the vibration that the drive element has to transmit to a substrate to be actuated, characterized in that a first face of the plate is fixed in a rigid manner to the drive element and in that a second face of the plate, opposite to the first face, is fixed by means of an actuation lug to the substrate to be actuated.

According to one embodiment of the invention, said drive element is preferably a piezoelectric actuator, but it could be another type of actuator, such as a magnetic actuator or an electrostatic actuator.

According to one embodiment, the plate is configured for generating a deformation with a maximum flexure at a main resonance frequency in the range between 20 kHz and 200 kHz.

In order for the actuator to be compatible with the haptic processes using ultrasonic lubrication, the plate is configured in such a manner that the amplitude of the vibration that it generates at the resonance frequency is greater by an amplification factor in the range between 4 and 50 than the amplitude of the vibration generated by the drive element alone.

According to one embodiment, the plate takes the form of a disk with a diameter in the range between 9 mm and 12 mm, for example 11 mm, and with a thickness in the range between 0.2 mm and 1 mm, for example 0.5 mm, for an unloaded operating frequency of around 60 kHz.

According to one advantageous embodiment, the plate takes the form of a parallelepipedic plate of length L in the range between 9 mm and 11 mm, for example 10 mm, of width B in the range between 4 mm and 6 mm, for example 5 mm, and of thickness h in the range between 1 mm and 2 mm, for example 1.5 mm, for an unloaded operating frequency of around 70 kHz.

According to another advantageous embodiment (FIG. 8), the plate is rectangular of length L substantially greater than its width B, and it comprises several drive elements on one of its faces and, on its opposite face, an actuation lug whose length corresponds to the length L of the plate and whose width b is less than the width B of the plate.

According to another embodiment (FIG. 10), the plate of length L is a closed surface in the form of a flat ring or 3D ring of width B. This plate in the form of a circle comprises spaced out drive elements situated on one of the faces of the ring, and an actuation lug extending on the other face of the ring over its whole circumference and having a width b less than the width B of the plate.

According to one embodiment (FIG. 3), the amplification factor for the movement of the drive element is a function of the ratio between the width b of the actuation lug and the length L of the plate, which allows the desired amplification factor to be controlled by varying this ratio. According to one preferred embodiment, the ratio b/L of the width of the actuation lug over the length of the plate is in the range between 0.1 and 0.45. However, according to other embodiments (FIGS. 8, 10), it is the ratio between the width b of the lug and the width B of the plate that allows the amplification factor to be controlled.

According to one embodiment, the drive element of the actuator is a square, rectangular or circular slab made of piezoelectric ceramic, whose largest dimensions (length, width, diameter) are in the range between 6 mm and 8 mm, in particular 7 mm, for an operating frequency of 64 kHz.

According to one practical embodiment, the actuator is configured in such a manner that the amplitude of its deformation in the direction perpendicular to the substrate at the main resonance frequency is in the range between 10 microns and 30 microns for the actuator not coupled to a substrate, and that the amplitude of the deformation transmitted by the actuator to a surface in coupled mode is in the range between 1 and 2.5 microns.

Preferably, the drive element and the plate of the actuator are rigidly attached by means of a strong adhesive with low energy dissipation, notably an Epoxy glue.

Another subject of the invention is a device comprising a viscoelastic surface to be actuated by a haptic effect, notably a haptic effect using ultrasonic lubrication, and comprising a plurality of actuators such as previously described.

According to one advantageous variant, said device comprises a mounting plate fixed perpendicularly to said substrate to be actuated, and one or more actuators which are fixed by means of their actuation lug onto said mounting plate.

In one advantageous embodiment, said substrate to be actuated comprises a surface with a low ability to conduct ultrasonic vibrations such as plastics or multilayer plates including a viscoelastic core. This may include devices such as OLED or LCD screens to be actuated by a haptic effect, notably a haptic effect using ultrasonic lubrication.

DETAILED DESCRIPTION

The invention will be described in more detail with reference to the appended figures, in which.

Figure 1:
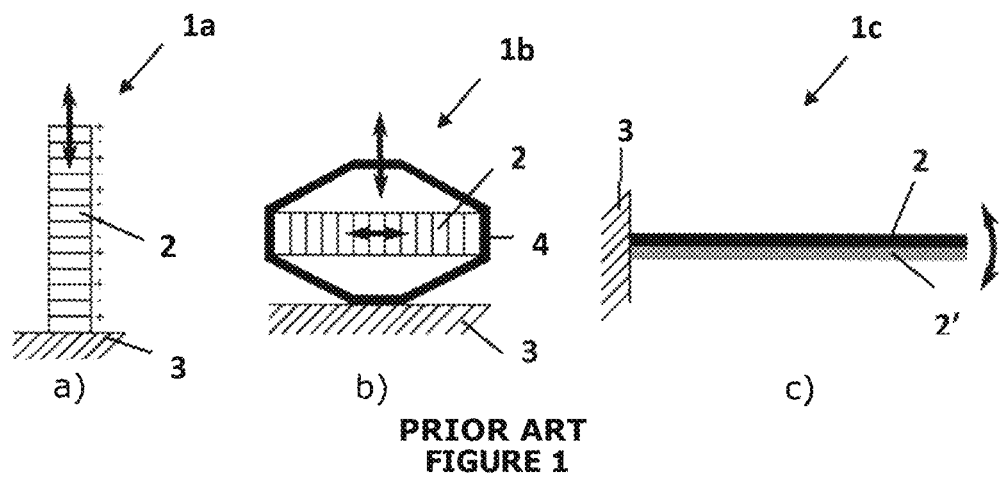
FIG. 1 shows schematically three known examples of piezoelectric actuators with increased deformation.

Reference is now made to FIG. 1 relating to three types of known devices allowing the deformation of a piezoelectric actuator to be amplified.

It is recalled that there exist two main types of piezoelectric actuators:
- non-amplified actuators, in which the displacement obtained is directly equal to the deformation of the piezoelectric material under the application of an electrical voltage.
- amplified actuators, in which a mechanical device is used to amplify the movement of the piezoelectric material, typically by a factor of 2 to 20.

At the present time, ceramic multilayers are conventionally used as drive elements in amplified piezoelectric actuators. The integration of this type of material imposes specific precautions, such as for example the necessity for providing a mechanical pre-stressing of or of avoiding torsional forces. Under the condition of a good design and correct use, piezoelectric actuators are extremely reliable and robust.

FIG. 1a corresponds to one example of a known amplified piezoelectric actuator 1a, composed of an assembly of layers of stacked elementary piezoelectric ceramics 2. The amplification effect is obtained by the multiplication of the deformation of one elementary ceramic 2 by the number of unitary ceramics present in the device. It can accordingly be seen that this can be effective from the point of view of the amplitude of the vertical movement generated, shown schematically by a bidirectional arrow, but the stacking implies that the dimensions of this actuator become too large and exclude this device for certain applications requiring actuators of limited size. Furthermore, this device needs a very rigid fixed attachment point 3, which is also itself quite large.

FIG. 1b corresponds to a piezoelectric actuator 1b known as a flextensional actuator, which is based on the principle of the stacking of unitary ceramics 2 in FIG. 1a, but by tilting the stack and enclosing it in a mechanical structure 4 which transforms the deformation of the ceramics 2 into a perpendicular deformation, shown schematically by the vertical double arrow. However, this known variant does not solve the problems inherent in the variant in FIG. 1a.

FIG. 1c corresponds to an actuator 1c known as a bimorphic actuator, comprising two piezoelectric ceramics 2, 2' operating in opposition. This structure has the advantage of offering a large displacement, but also requires a fixed and rigid reference point 3, and in the end is not suitable for actuating a surface, such as the surface of a screen for example.

Figure 2:
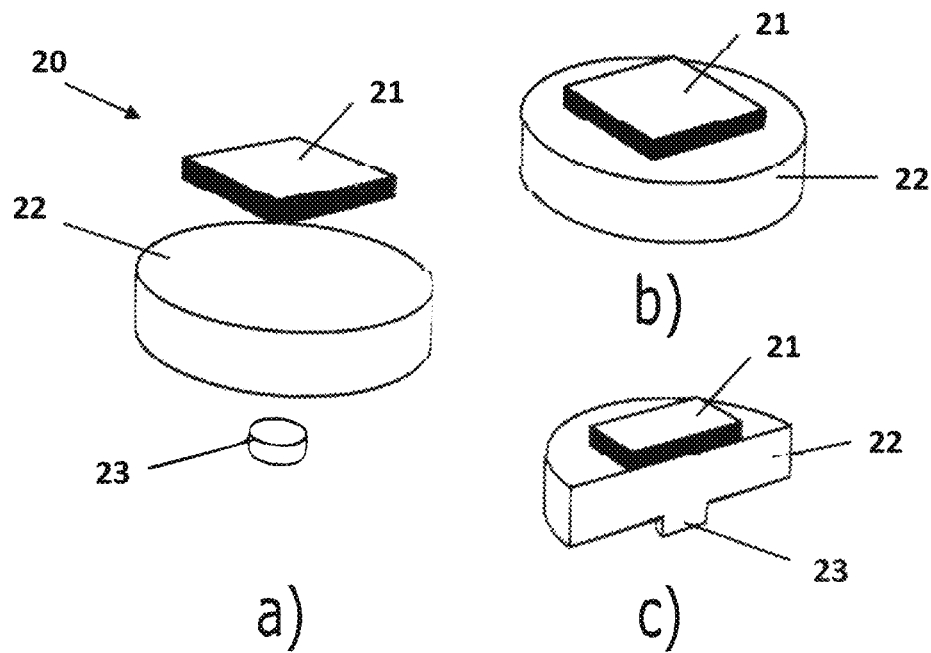
FIG. 2 shows schematic diagrams of a first embodiment of an actuator according to the invention, as an exploded perspective view, as an assembled perspective view and as a cross-sectional perspective view.

FIG. 2 shows an amplified actuator 20 according to a first embodiment of the invention, as an exploded perspective view (a), as an assembled perspective view (b) and as a cross-sectional perspective view (c).

This first embodiment is composed of a piezoelectric drive element 21 in the top part, of an amplification plate 22, here of circular shape, rigidly attached to the drive element 21 which will set it into vibration in flexure mode, and of an actuating lug or pin 23 rigidly fixed to the plate 22. This actuation lug is designed to transmit the movements of the composite assembly formed by the drive element 21 and the plate 22 to a surface to be actuated (not shown in this figure).

The actuation lug 23 is situated on the face of the plate 22 opposite to that carrying the drive element 21.

The drive element 21 is preferably, but not necessarily, an elementary piezoelectric actuator in the form of a ceramic slab. It is shown in the shape of a square, but it could be circular or of another shape. In a known manner, the ceramic slab 21 has two metal electrodes (not shown) for the application of a power supply voltage allowing the piezoelectric effect to be obtained, namely a deformation of the thickness of the ceramic as a function of the applied electrical voltage.

According to the invention, the ceramic slab 21 is bonded as rigidly as possible onto the amplification plate 22, for example by means of a layer of Epoxy adhesive (not shown), in order to avoid as far as possible the dissipations of energy at the interface between the ceramic slab 21 and the plate 22. When the adhesive used is electrically insulating, it is necessary to apply the excitation voltage directly onto the electrodes of the piezoelectric slab. In contrast, when the adhesive used is electrically conducting and when the plate 22 is metal, for example made of brass, steel or zinc, it is possible to apply the excitation voltage between the upper electrode of the piezoelectric slab 21 and the plate 22.

According to the first embodiment shown in FIG. 2, the plate 22 takes the form of a circular disk. In order to obtain a resonance frequency in the ultrasonic range targeted, namely from 20 kHz to 200 kHz, its thickness may for example be in the range between 0.2 mm and 1 mm, for example 0.5 mm, and its diameter may be in the range between 9 mm and 12 mm, for example 11 mm, as a function notably of the resonance frequency sought, for example 60 kHz unloaded, in other words prior to coupling with a surface to be actuated, and also as a function of other parameters such as notably the density of the material used for the plate.

According to one advantageous embodiment, the piezoelectric ceramic 21 has a surface area in the form of a square of around 7 mm on a side inscribed in the surface area of the plate 22, and with a thickness of around 0.5 mm, in the case of a targeted operating frequency of around 64 kHz.

The actuation lug 23 is composed either of a rigid element, for example made of metal or of glass mounted onto and rigidly attached to the plate 22 (FIG. 2a), or of an extension of the material of the plate 22 (FIG. 2c). This second solution allows additional energy dissipations to be avoided since there is no adhesive interface between the plate 22 and the actuation lug 23.

When the actuator 20 is fixed to a surface to be actuated (not shown in FIG. 2), the deformations of the ceramic slab 21 are transmitted to the plate 22 which amplifies them and transmits them to said surface to be actuated by means of the actuation lug 23.

FIG. 3a shows a second practical embodiment of an actuator 20 according to the invention. In this configuration, rectangular parallelepipedic structures are used for the drive element 21 and for the plate 22 whose flexure behaves like a beam of rectangular cross-section.

The dimensions of the actuation lug 23 are small with respect to the plate and it is centered with respect to the plate.

In the embodiment shown, the plate 22 has a width B, a length L, and a thickness h.

The transverse bending movements of a beam of rectangular cross-section, denoted y(x, t), are expressed by the following wave equation:

$$E \cdot I \cdot \partial^4 y(x,t)/\partial x^4 + \rho \cdot \partial^2 y(x,t)/\partial t^2 = 0 \qquad \text{[Math 1]}$$

where E denotes Young's modulus,

[Math 2] $I=B \cdot h^3/L^2$ denotes the quadratic moment along the y-axis, and $\rho$ denotes the density of the beam. For a harmonic solution (sinusoidal regime), the equation [Math 1] becomes:

$$(E \cdot I \cdot \delta^4/\delta x^4 - \omega^2 \cdot \rho) \cdot Y(x) = 0 \quad [\text{Math 3}]$$

where Y (x) denotes the amplitude of the transverse vibrations along the x-axis. In free-free condition, the solution of the equation [Math 3] leads to the following expression [Math 4] in which [Math 5] $\beta_n = \sqrt[4]{\rho \omega^2_n}$ represents the wave number:

$$Y_n(X) = \cos \beta_n x + \cos h\beta_n x - ((\cos \beta_n L - \cos h\beta_n L))/(\sin \beta_n x + \sin h\beta_n x))/(\sin \beta_n L - \sin h\beta_n L) \quad [\text{Math 4}]$$

where the index n indicates the number of the vibration mode. The frequency of each natural vibration mode of the beam alone in flexure mode is given by the following formula [Math 6]:

$$f_n = (2\pi)^{-1} (\beta_n \cdot l)^2 \sqrt{(E \cdot I/\rho \cdot l^4)} \quad [\text{Math 6}]$$

It is therefore observed that, in order to obtain a given frequency of vibration, several geometries (length, width, thickness) of the plate 22 in the form of a beam could be suitable.

FIGS. 3b and 3c respectively show a side view and a perspective view of one particular embodiment of a parallelepipedic actuator 20 of width B and of length L, in the flexed position corresponding to a particular moment in time for the actuator in operation. In the example shown, the width and the length of the ceramic slab 21 are equal to those of the plate 22 but this is not obligatory. The actuation lug 23 has a length B equal to the width of the plate, and a width b less than the length L of the plate.

Figure 4:
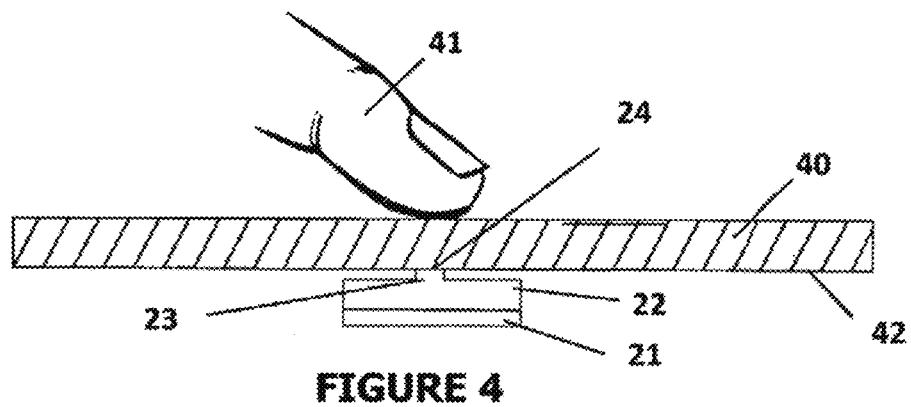
FIG. 4 shows a cross-sectional view of one exemplary assembly of an actuator according to the invention on a substrate to be actuated.

FIG. 4 shows schematically the installation of an amplified actuator 20 according to the invention on one face of a substrate 40 to be actuated, taking the form of a plate. The actuator 20 is fixed (bonded) onto the lower face 42 of the substrate 40 to be actuated via the free face 24 of the actuation lug 23. Thus, the plate 22 of the actuator is located between the actuation lug 23 and the ceramic slab 21. In order to limit the losses by dissipation of energy, the mounting used to fix the actuation lug 23 onto the lower face 42 of the substrate 40 to be actuated must also be as rigid as possible, using for example an Epoxy adhesive. The terminals of the piezoelectric slab 21 are then supplied with an excitation signal at an ultrasonic frequency by means of electrodes (not shown).

The amplitude of the movement of the uncoupled amplified actuator 20 may then be of the order of 10 to 30 microns, greater by a factor 4 to 50 than the amplitude of the known piezoelectric actuators.

Furthermore, the amplitude of the movement caused by the actuator 20 on the surface of the substrate 40 to be actuated via the actuation lug 23 is also amplified by a factor 4 to 50 with respect to that which would be transmitted by a non-amplified actuator according to the prior art.

The increased deformation of the substrate 40 then has an amplitude of the order of 1 to 2.5 microns at the ultrasonic resonance frequency, and is then clearly felt by the finger 41 of a user positioned on the upper face of the substrate 40 to be actuated, even if the latter is made of a viscoelastic material such as a plastic, wood, or equivalent material.

Figure 5:
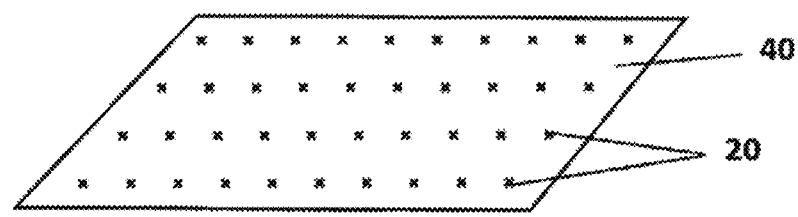
FIG. 5 shows a distribution diagram of multiple actuators according to the invention on a surface to be actuated.

When it is necessary to produce a haptic effect differentiated at several points of a substrate 40 to be actuated, or when the substrate to be actuated exhibits too great a loss of the vibrations, it is then possible to equip one face of this substrate 40 with an array of amplified actuators 20 or 50 (FIG. 8), for example a matrix array of actuators 20 or 50 as shown schematically in FIG. 5.

Figures 6, 7:
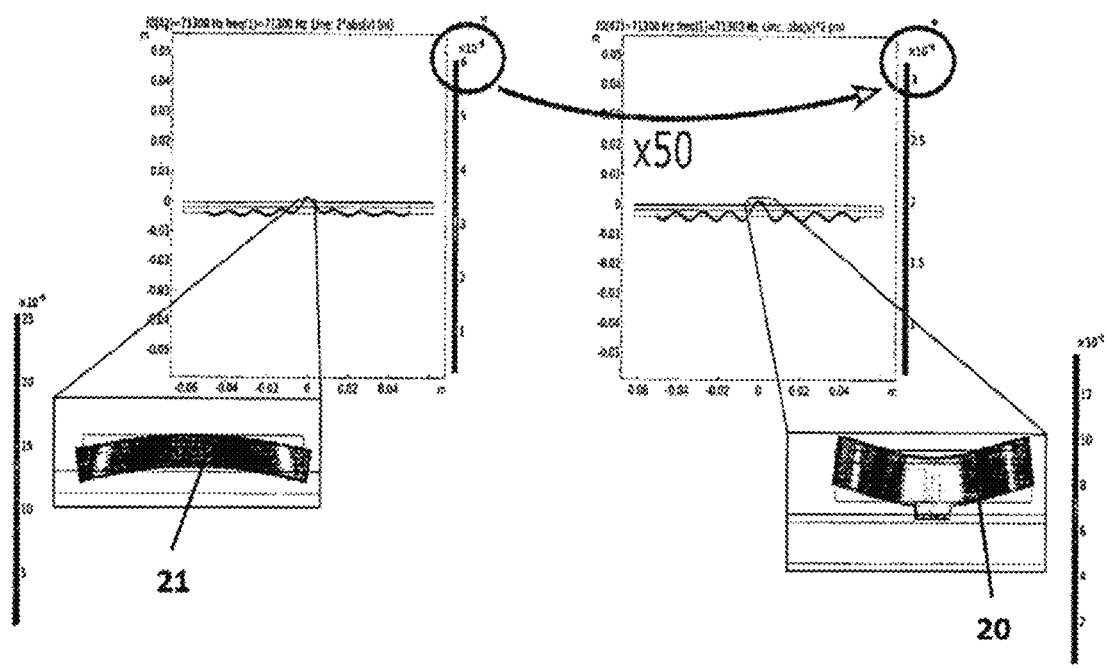
FIG. 6 shows a graph illustrating the effect of amplification of the amplitude of the movement of an actuator according to the invention.
FIG. 7 shows a curve showing the maximum amplitude of deformation of a substrate of the actuator as a function of the ratio between the width of the actuation lug and the length of the amplification plate of the piezoelectric actuator.

FIG. 6 shows the results of a simulation of the amplitude of displacement of an amplified piezoelectric actuator 20 according to the invention, coupled to a substrate 40 to be actuated, and operating at an ultrasonic frequency of 71.3 kHz.

In the left-hand part of FIG. 6, the actuator used is a simple non-amplified piezoelectric slab 21. The amplitude of the bending deformation between its edges and the center, which corresponds to the maximum deformation point, is approximately equal to $2.10^{-8}$ meter, or 0.02 microns.

In the right-hand part of FIG. 6, the actuator used is an amplified actuator 20 according to the invention. The amplitude of the bending deformation between the edges and the center, which corresponds to the maximum deformation point, is approximately equal to $10^{-6}$ meter, or 1 micron. The invention has therefore allowed, in this particular case, an amplitude barely detectable by a human finger (0.02 microns) to be amplified by a factor 50 into a much more detectable amplitude of displacement of the surface of the plate of 1 micron.

Tests have shown that, for a given frequency of operation and a given type of surface, the amplitude of displacement of a substrate 40 obtained by the amplified actuator 20 according to the invention is highly dependent on the ratio between the dimensions of the amplification plate 22 and those of its actuation lug 23. The results of the tests are reproduced in the curve in FIG. 7, whose ordinate gives the amplitude of the deformation of the actuator according to the invention as a function of the ratio denoted b/L between the width b of the actuation lug and the length L of the plate 22 of the actuator in FIG. 3, as abscissa.

As can be seen, this amplitude of deformation remains greater than a micron as long as the aforementioned ratio b/L remains within a range of values included between around 0.1 and 0.45. The maximum amplitude is even close to 2.5 microns when said dimensional ratio b/L is of the order of 0.3, for a single frequency and a single substrate hence in coupled mode.

Figure 3:
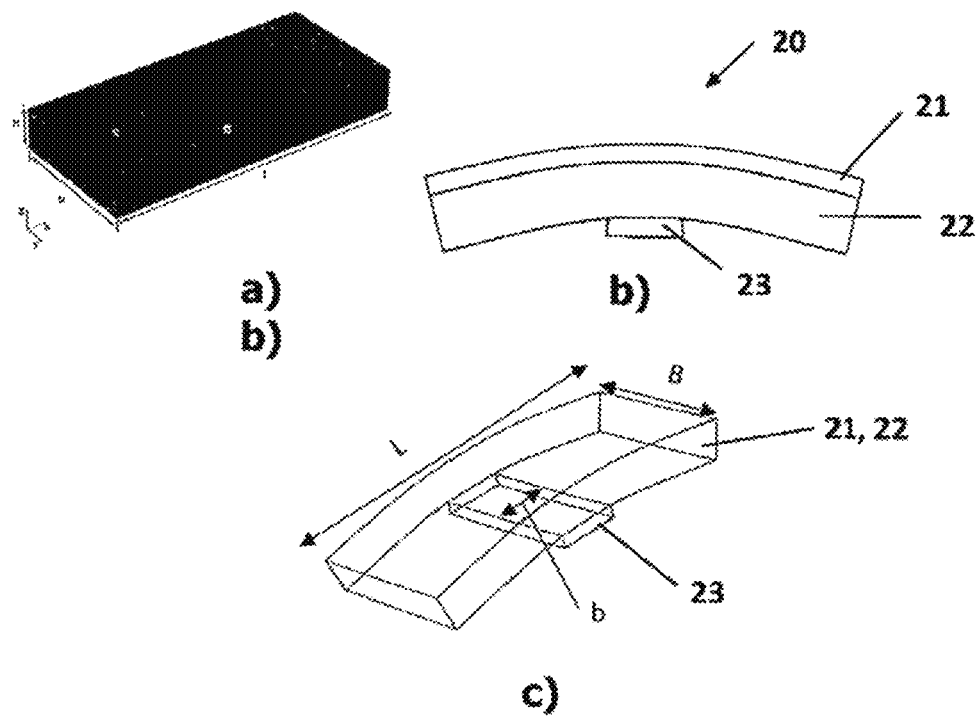
FIG. 3 shows several schematic diagrams of a second embodiment of an actuator according to the invention.

The principle of the invention may furthermore be implemented in embodiments other than those in FIGS. 2 and 3.

Figure 8A:
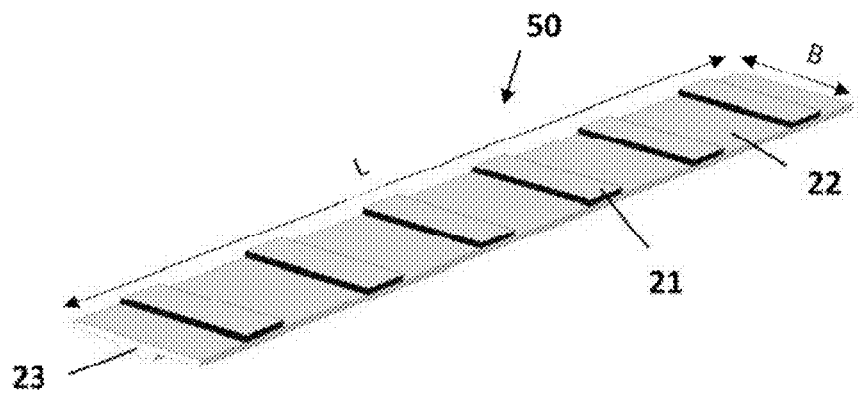
FIGS. 8A to 8C show perspective views of one variant of an actuator according to the invention, seen on its own from above (FIG. 8A), from below (FIG. 8B), and seen from above with its modal shape (FIG. 8C), respectively.
Figure 8B:
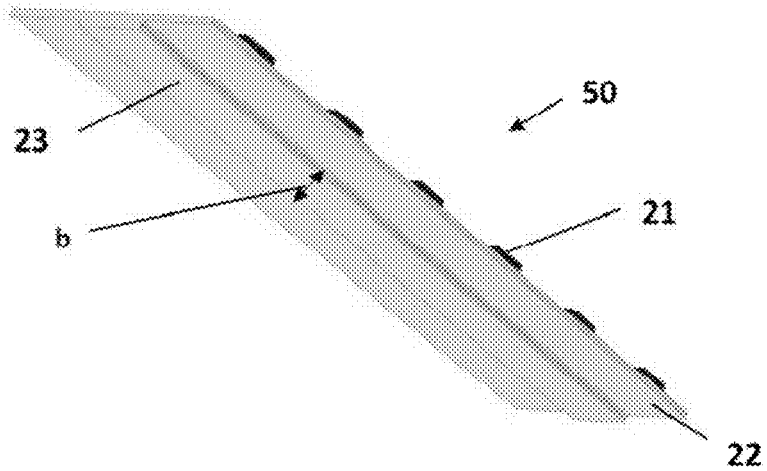

Thus, as shown in FIGS. 8A, 8B, one particularly advantageous embodiment consists in adding several drive elements 21 on one face of a plate 22 again of rectangular shape but with a length L much greater than its width B. A series of drive elements 21, notably made of ceramic, are fixed onto one face of this plate. The drive elements 21 are separated by regions with no drive element, which allows the surface area of drive element needed, a fairly costly component, to be economized with no detriment to the result obtained. As previously, an actuation lug 23 is disposed on the face of the plate 22 opposite to that carrying the drive elements 21. However, in this embodiment, the actuation lug takes the form of a longitudinal rail of width b running along the length L of the rectangular plate 22 (rather than the width B of the plate as in FIG. 3). The actuation lug or rail 23 here is again either separate and rigidly fixed onto the plate 22, or directly formed by a protrusion of the plate 22. In this embodiment, it is the ratio between the width b of the actuation lug 23 and the width B of the plate 22 which allows the amplification factor to be controlled.

Figure 8C:
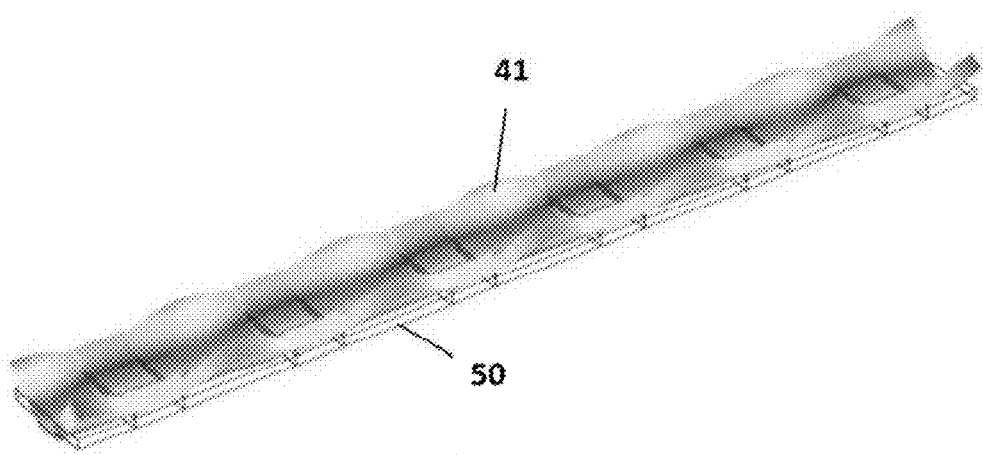

FIG. 8c shows the profile of the modal shape 41 which allows the vertical displacement of the actuation lug to be maximized, for the uncoupled actuator 50.

Figure 9:
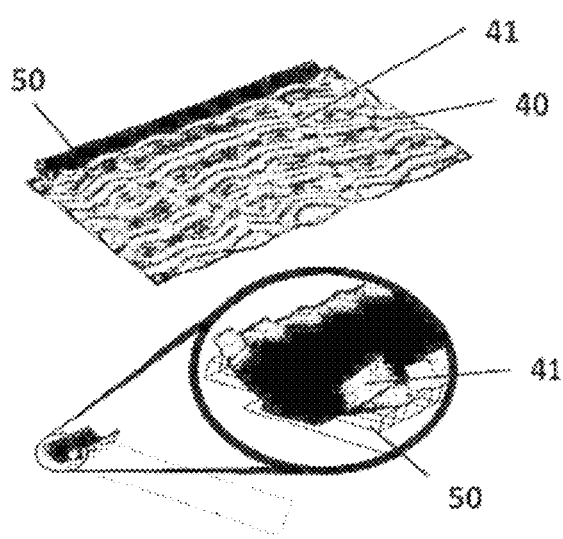
FIGS. 9a and 9b show digital 3D finite element simulations (COMSOL) showing the modal shape 41 obtained by calculation of the natural modes of the assembly consisting of an actuator according to FIG. 8 and a vibrating surface for two different geometries of the surface to be actuated.
Figure 9:
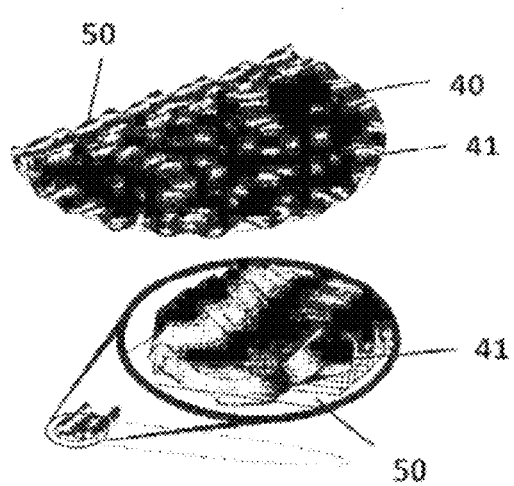

FIGS. 9a and 9b show the vibrational mode analysis carried out on two coupled systems for an actuator 50 with two different structures 40 to be actuated (one in the form of a rectangular plate in FIG. 9a, the other in the form of a semi-circular plate in FIG. 9b), and it is observed that the profile of the modal shape 41 in FIG. 8c is again seen in each of the two configurations in FIGS. 9a and 9b. In other words, the resonant mode of the free actuator 50 is preserved for the coupled system, independently of the geometry of the plate to be actuated.

Figure 10A:
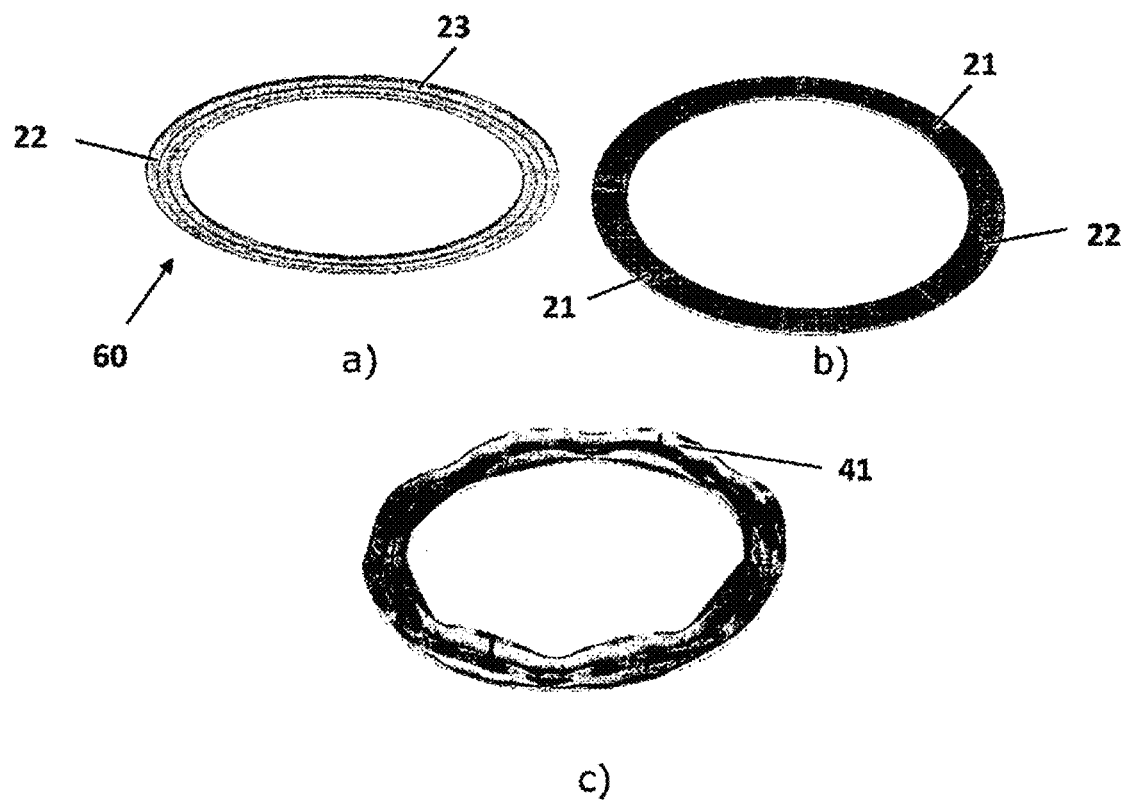
FIGS. 10A and 10B show two variants of an actuator using an amplification plate in the form of a ring.
Figure 10B:
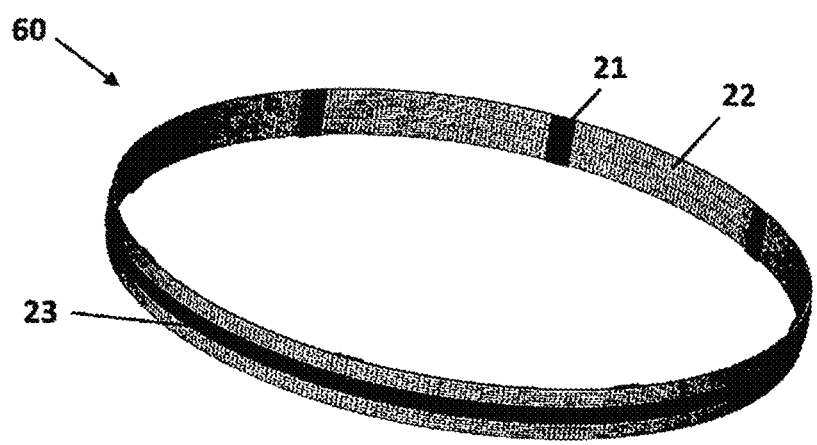

Another embodiment of an actuator 60 according to the invention is shown schematically in FIG. 10. It uses a plate 22 in the form of a flat ring (FIG. 10A), or a plate 22 in the form of a 3D ring (FIG. 10B). In these scenarios, the drive elements 21 may be situated on one of the faces of the plate 22, and the actuation lug 23 is then situated on the opposite face of the plate 22 and extends around the plate over its whole circumference. In this embodiment, it is again the ratio between the width b of the actuation lug and the width B of the plate 22 which allows the amplification factor to be controlled. An actuator 60 in the form of a 3D ring may notably be used to actuate a sphere, a cylinder, a lever, etc.

Figure 11A:
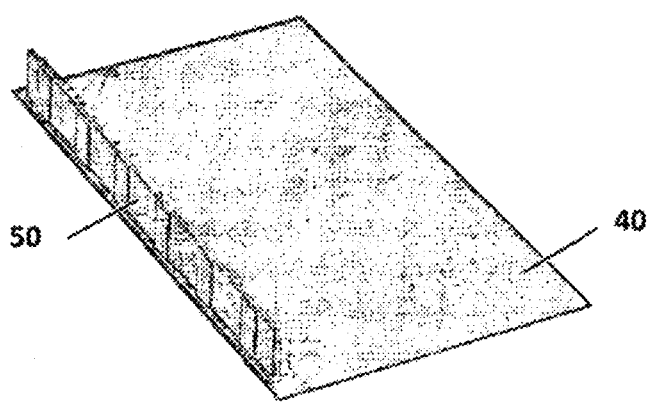
FIGS. 11A and 11B show, respectively, a perspective and cross-sectional view of a device incorporating an actuator according to FIG. 8.
Figure 11B:
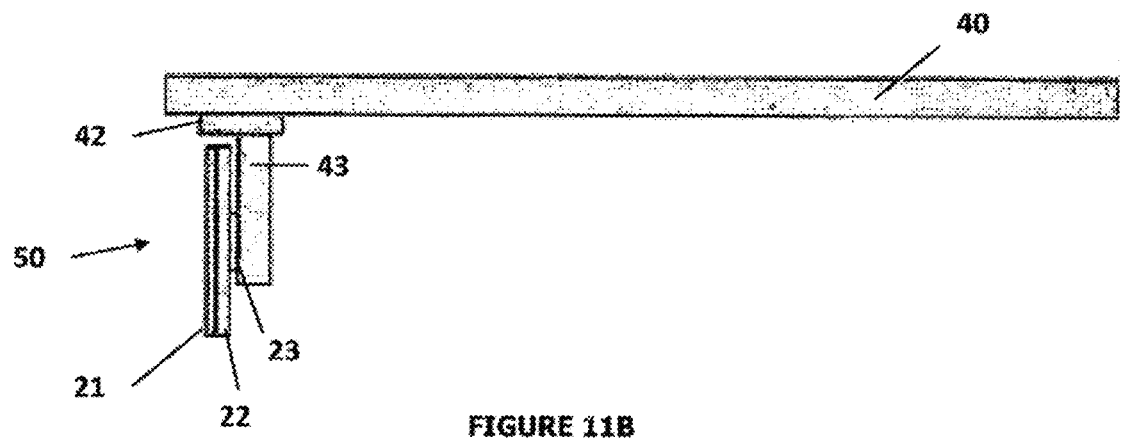

Reference is now made to FIG. 11 which shows one advantageous use of the actuator 50 in FIG. 8, in order to cause a rectangular surface to vibrate, which is for example a surface of a substrate 40 forming part of a screen on which it is desired to generate a haptic feedback effect by ultrasonic lubrication.

In this embodiment, the actuator 50 in FIG. 8 may be turned at 90° and mounted onto a mounting plate 43 (FIG. 11B) coupled by a rigid attachment 42 to the surface of the substrate 40 to be made to vibrate. This allows a gain in the compactness, the surface of the actuator 50 no longer being situated in the plane of the substrate 40 to be actuated, but in a plane perpendicular to it.

It should be noted that it would also be possible to fix onto the mounting plate 43 several elementary actuators 20 according to FIG. 2 or to FIG. 3, and/or several actuators 50 in FIG. 8, instead and in place of the single actuator 50 shown in FIG. 11.

In the configuration of FIG. 11, the flexure waves in the substrate 40 to be made to vibrate are generated by the creation of a bending moment. The latter is maximized by the presence of the actuator 50, which creates a vibration of high amplitude independently of the shape of the surface to be made to vibrate, as mentioned in relation with FIG. 9. An optimization of this vibration may be obtained by adjusting the various dimensions of the actuator 50.

Advantages of the Invention

The invention meets the aims targeted and allows high amplitudes of haptic feedback to be obtained including on viscoelastic surfaces exhibiting a strong attenuation of ultrasonic waves, such as plastics, wood, or touchscreens with optical adhesive bonding between the surface glass and the display.

The invention allows ultrasonic displacements to be created that are greater than with the known piezoelectric actuators, sufficient to obtain the effect of ultrasonic lubrication, namely the modification of the friction of the finger on surfaces excited by a standing wave, even if these surfaces are of the type that dissipate vibrational energy.

The invention also allows the need for a bulk mechanical reference to be obviated, which allows an enhanced miniaturization of the amplified actuator.

The invention therefore allows actuators with increased deformation to be used directly on surfaces with friction programmed by ultrasonic lubrication.

The novel structure is particularly simple and inexpensive to implement, which allows large surface areas, or surfaces which heretofore could not benefit from a significant haptic feedback effect, for example rear faces of screens, to be equipped with actuators according to the invention.

The invention claimed is:

1. An electromechanical actuator with increased deformation, comprising:
   at least one drive element connected to a source of AC voltage so as to produce a deformation of said at least one drive element;
   a plate configured for amplifying the amplitude of the vibration of the at least one drive element being transmitted to a substrate to be actuated, wherein a first face of the plate is rigidly fixed to the drive element and a second face of the plate, opposite to the first face, is fixed by means of an actuation lug to the substrate to be actuated; and
   wherein the plate is configured for generating a deformation with maximum flexure at a main ultrasonic resonance frequency greater than 20 KHz in order to obtain ultrasonic deformations of the substrate sufficient to obtain an ultrasonic lubrication effect on the substrate.

2. The electromechanical actuator as claimed in claim 1, wherein the actuation lug is smaller than the plate and is centered with respect to the plate.

3. The electromechanical actuator as claimed in claim 1, wherein said at least one drive element is a piezoelectric actuator, a magnetic actuator or an electrostatic actuator.

4. The electromechanical actuator as claimed in claim 1, wherein the plate is configured for generating the deformation with maximum flexure at the main ultrasonic resonance frequency in the range between 20 KHz and 200 KHz.

5. The electromechanical actuator as claimed in claim 1, wherein the shapes, dimensions and material of the plate are chosen such that the amplitude of the vibration generated by the plate at a resonance frequency is greater by an amplification factor in the range between 4 and 50 than the amplitude of the vibration generated by the at least one drive element alone.

6. The electromechanical actuator as claimed in claim 1, wherein the at least one drive element is a slab made of piezoelectric ceramic of square, rectangular or circular shape whose largest dimensions are in the range between 6 mm and 8 mm for an operating frequency of 64 KHz.

7. The electromechanical actuator as claimed in claim 1, being configured such that the amplitude of its deformation in the direction perpendicular to the substrate at a main resonance frequency is in the range between 10 microns and 30 microns for the electromechanical actuator not coupled to the substrate, and that the amplitude of the deformation transmitted by the actuator to the substrate in coupled mode is in the range between 1 and 2.5 microns.

8. The electromechanical actuator as claimed in claim 1, wherein the at least one drive element and the plate are rigidly attached with an adhesive with low energy dissipation or an Epoxy adhesive.

9. A device comprising a substrate to be actuated by a haptic effect, comprising at least one of the electromechanical actuator as claimed in claim 1.

10. The device as claimed in claim 9, comprising the substrate to be actuated, a mounting plate fixed perpendicularly to the substrate, and one or more actuators fixed by means of their actuation lug onto the mounting plate.

11. The device as claimed in claim 9, wherein said substrate is a display screen.

12. The electromechanical actuator as claimed in claim 1, wherein the plate has the form of a disk of diameter in the range between 9 mm and 12 mm and of thickness in the range between 0.2 mm and 1 mm for an unloaded operating frequency of around 60 KHz.

13. The electromechanical actuator as claimed in claim 12, wherein the plate has the form of a disk of diameter 11 mm and of thickness 0.5 mm.

14. The electromechanical actuator as claimed in claim 1, wherein the plate takes the form of a parallelepiped of a length L, of a width B and of a thickness h.

15. The electromechanical actuator as claimed in claim 14, wherein the length L of the plate is in the range between 9 mm and 11 mm, the width B is in the range between 4 mm and 6 mm, and the thickness h is in the range between 1 mm and 2 mm, for an unloaded operating frequency of around 70 KHz.

16. The electromechanical actuator as claimed in claim 14, wherein the plate has a length L of 10 mm, a width B of 5 mm, and a thickness h of 1.5 mm.

17. The electromechanical actuator as claimed in claim 14, wherein an amplification factor for the movement of each drive element is a function of a ratio b/L between the width b of the actuation lug and the length L of the plate.

18. The electromechanical actuator as claimed in claim 17, wherein the ratio b/L of the width b of the actuation lug over the length L of the plate is in the range between 0.1 and 0.45.

19. An electromechanical actuator with increased deformation, comprising:
a plurality of drive elements connected to a source of AC voltage so as to produce a deformation of the plurality of drive elements;
a plate configured for amplifying the amplitude of the vibration of the plurality of drive elements being transmitted to a substrate to be actuated, wherein a first face of the plate is rigidly fixed to the drive element and a second face of the plate, opposite to the first face, is fixed by means of an actuation lug to the substrate to be actuated; and
wherein a length L of the plate is greater than a width B of the plate, and the actuation lug has of the same length L as the plate and a width b of the actuation lug is less than the width B of the plate.

20. The electromechanical actuator as claimed in claim 19, wherein an amplification factor for the movement of each drive element is a function of the ratio b/B between the width b of the actuation lug and the width B of the plate.

21. An electromechanical actuator with increased deformation, comprising:
at least one drive element connected to a source of AC voltage so as to produce a deformation of said at least one drive element;
a plate configured for amplifying the amplitude of the vibration of the at least one drive element being transmitted to a substrate to be actuated, wherein a first face of the plate is rigidly fixed to the drive element and a second face of the plate, opposite to the first face, is fixed by means of an actuation lug to the substrate to be actuated; and
wherein the plate has a closed surface in the form of a flat or 3D ring and comprises spaced out drive elements situated on one of the faces of the plate and the actuation lug situated on the opposite face of the plate and extending over the length L of the plate and having a width b less than a width B of the plate.

* * * * *